United States Patent [19]

Fantozzi

[11] 3,932,770

[45] Jan. 13, 1976

[54] CONTROL CIRCUIT FOR SWITCHING TRIACS

[75] Inventor: Louis John Fantozzi, Penfield, N.Y.

[73] Assignee: Xerox Corporation, Stamford, Conn.

[22] Filed: Sept. 16, 1974

[21] Appl. No.: 506,664

Related U.S. Application Data

[63] Continuation of Ser. No. 338,808, March 7, 1973, abandoned.

[52] U.S. Cl. ....... 307/252 UA; 307/252 B; 307/311
[51] Int. Cl.² .......................................... H03K 17/00
[58] Field of Search........ 307/252 B, 252 K, 252 M, 307/252 N, 252 Q, 252 T, 252 UA, 311, 315

[56] References Cited
UNITED STATES PATENTS

| | | | |
|---|---|---|---|
| 3,284,695 | 11/1966 | Welsz................................. | 307/315 |
| 3,412,293 | 11/1968 | Maupin.............................. | 307/315 |
| 3,459,943 | 8/1969 | Harnden........................... | 307/252 B |
| 3,663,838 | 5/1972 | Reimers........................... | 307/252 K |
| 3,693,027 | 9/1972 | Garaway............................ | 323/25 |
| 3,693,060 | 9/1972 | Joyce ............................ | 307/252 T |
| 3,700,319 | 10/1972 | Gallina............................ | 307/252 B |
| 3,723,769 | 3/1973 | Collins.......................... | 307/252 UA |
| 3,812,382 | 5/1974 | Pascente...................... | 307/252 UA |

OTHER PUBLICATIONS

Optical Link Isolates Low-Cost Solid-State Relay, ED-N-EE, 5/15/71—p. 69.
Using the Triac for Control of AC Power — GE Application Note — 3/66, pp. 1.

*Primary Examiner*—John S. Heyman
*Assistant Examiner*—B. P. Davis

[57] ABSTRACT

A circuit comprising an A.C. source, a load and a TRIAC for supplying A.C. power to the load from the source. The TRIAC includes first, second, and gating electrodes with the first electrode being connected in series with the load. The A.C. source is applied across the TRIAC and the load. A trigger circuit is provided for the TRIAC comprising a photodarlington circuit and a circuit for biasing the photodarlington circuit to its quiescent state in the absence of a light signal and for making the photodarlington circuit conductive and enabling it to apply a negative voltage to the gate electrode of the TRIAC to make the TRIAC conductive in the presence of a light signal.

4 Claims, 5 Drawing Figures

CONTROL CIRCUIT FOR SWITCHING TRIACS

BACKGROUND OF THE INVENTION

This is a continuation application of U.S. patent application Ser. No. 338,808, filed on Mar. 7, 1973 now abandoned.

This invention relates to a digital trigger for an AC switch and, in particular, to an improved triac AC switch.

A triac switch has become a very useful device as an AC switch. Triac is a coined mnemonic expression that stands for a triode (three electrode) AC switch. The triac is triggered in its conduction very much in a manner similar to the well known action as SCR. The triac differs from the SCR in that it conducts in both directions of current flow, once triggered into conducting state. Because of the foregoing characteristics, a triac has been used as an AC switch element to control AC power supply to a load. In applying the triac as an AC switch, ie., in triggering the triac into conduction, various attempts have been used with a degree of satisfaction. For example, a dry reed switch has been used as a trigger for applying a line voltage through a limiting circuit to the gate electrode of the triac to switch it into its conductive state. While the dry reed is satisfactory to a degree, it is bulky, requiring more printed circuit board area for the device itself. It is also more difficult to interface the dry reed because its coil which may be interfaced with conventional digital logic operated by a low voltage (e.g., 5 volts) requires substantially higher current than that used by the digital logic. It is also more costly.

It is an object of the present invention to provide an improved trigger circuit for an AC switch and, more specifically, to provide an improved circuit for switching a triac.

BRIEF SUMMARY OF THE INVENTION

The foregoing and other objects of the present invention are achieved by using a photodarlington circuit as a buffer or interface element between a signal source consisting of a light emitting diode (LED) and the AC load switching triac. The foregoing and other features of the present invention will be understood more clearly from the following detailed description of an illustrative embodiment of the present invention in conjunction with the accompanying drawings, in which.

DETAILED DESCRIPTION OF THE ILLUSTRATIVE EMBODIMENT OF THE INVENTION

Figure 1:
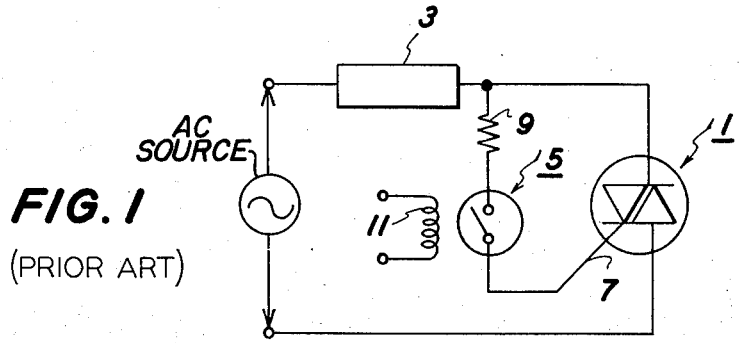
FIG. 1 shows a dry reed switch used to trigger a traic AC switch according to the prior art.

As shown in FIG. 1, a triac AC switch 1 is used to switch AC power source, for example, 120 v. AC, on and off from the load 3. Thus, when the triac is switched into conducting state the AC source is applied across the load 3. But, when it is switched off, it becomes open and cuts the AC power off from load 3.

For triggering the triac into its conducting state, according to the prior art, a dry reed switch 5 is used. As shown in FIG. 1, the reed switch is connected between the AC source and the trigger electrode 7 of the triac. A resistor 9 establishes voltage level applied to the gate electrode 7 The dry reed switch closes its normally open contact when a current is applied to its windings 11 in the well known manner.

Figure 2:
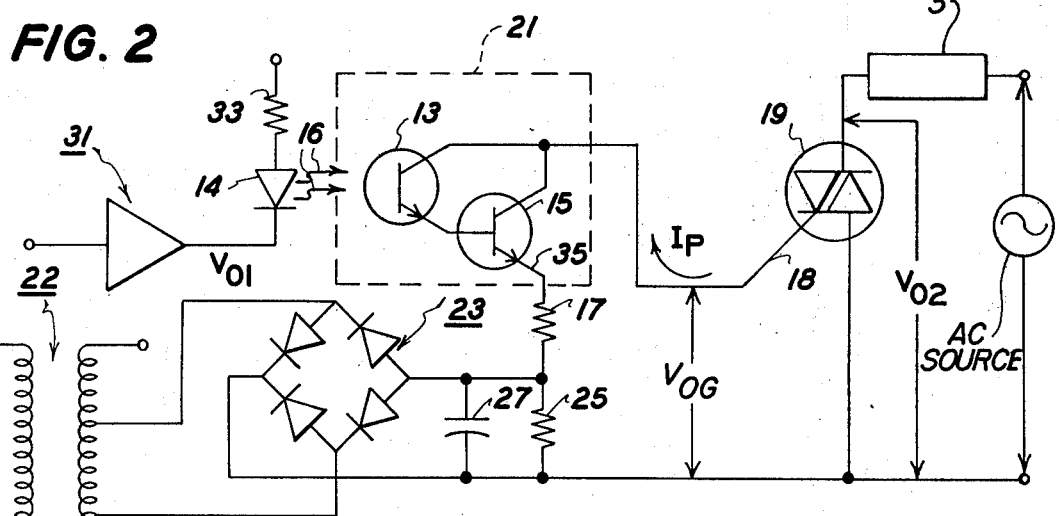
FIG. 2 shows a photodarlington transistor circuit interposed between an input source with an LED and a triac AC switch according to the present invention.

According to the present invention, as shown in FIG. 2, instead of the dry reed switch, a circuit 21 arranged in a darlington configuration is used to switch the triac. The circuit includes a phototransistor 13 connected to detect a light signal generated by a light emitting diode 14. The circuit also includes a transistor 15 connected to amplify the current to a level compatible with triac gate current requirements.

The transistor 15 amplifies the current from the phototransistor and causes the amplified current to flow through its emitter and collector. This causes a DC current to flow through the gate resistor 17 and power supply bridge 23. This current establishes a negative gating potential to the gating electrode 18 which is sufficient to trigger the triac as long as the photodarlington circuit remains in its conductive state.

The photodarlington circuit 21 may be biased to its quiescent operating state by applying a suitable negative DC bias voltage (not shown) at the emitter electrode of the transistor 15. The DC bias voltage may be generated from the same AC power source, for example, 110 v. 60 AC used for the load. As shown in FIG. 2, this is done by using a step down transformer 22 which taps off a portion of the AC source. The AC from the secondary is rectified by a suitable bridge circuit 23 such as that shown and its DC output is smoothed out to a desired level by an RC circuit 25 and 27 in a conventional manner. A resistor 17 of a suitable magnitude is used to adjust the current to a level necessary to bias the photodarlington circuit into its appropriate quiescent operating state.

As shown, the phototransistor may be triggered into operation by a light signal coming from the light emitting diode 14 normally biased in non-conducting state by a suitable circuit such as a conventional digital logic state 31. The circuit is connected such that switching of the gate to its logic "O" (positive logic) state forward biases the diode 14. In turn, the light emitting diode conducts and emits light 16 which triggers the phototransistor into conduction. A resistor 33 is used to limit the current flowing through the diode 14 to a certain acceptable level of amplitude.

Figure 3:
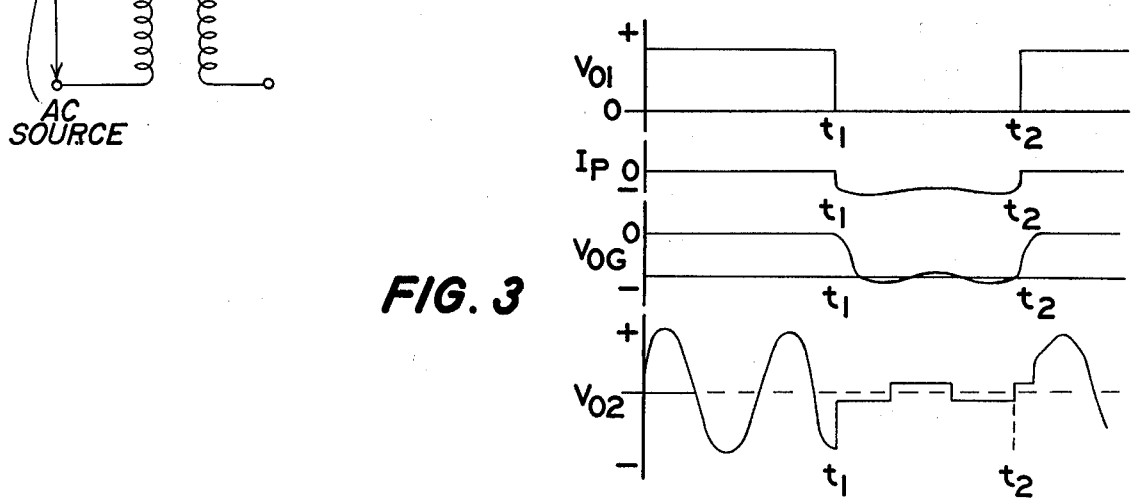
FIG. 3 shows a set of wave forms useful in explaining the operation of the circuit shown in FIG. 2.

The circuit according to the present invention operates as follows. The input signal wave may be in the form of a digital signal which causes the logic gate 31 to produce an output in a digital wave form, $V_{o1}$, as shown in FIG. 3. The input to the logic gate 31 may be negative going or positive going digital waves. Regardless, the output can be made to go from a positive voltage to zero as shown by using inverting or non-inverting digital logic gate. As shown, when the logic gate changes its output to a ground level from the positive level at time $t_1$ in response to the input signal, the light emitting diode 14 conducts and emits the light 16. This light triggers the phototransistor 13 and causes it to conduct. This, in turn, causes transistor 15 to conduct and amplify the current from the phototransistor 13 to a level which switches the triac 19 into its conducting state. The current $I_p$ driving the triac and the DC potential applied to the gate electrode 18 during these operations appear in the wave forms $I_p$ and $V_{OG}$ in FIG. 3. A capacitor 27 connected in parallel with the resistor 25 forms an RC circuit which filters the full wave rectified voltage from the bridge rectifier 23 before the rectified voltage is applied to the triac via the darlington circuit 21 to prevent the triac from switching into non-conducting state due to the ripple that would otherwise be present in the rectified voltage.

The triac 19 does not conduct as long as the photodarlington circuit does not detect light from LED. In this state, the voltage across the triac remains the same as the AC power source potential as shown by $V_{02}$. Current is allowed to flow therethrough as the triac becomes conductive in response to the gating voltage applied to the gate electrode 18. The potential drop thereacross becomes negligible and remains so as shown by $V_{02}$ as long as the conducting photodarlington circuit keeps the gate electrode at a negative potential.

While the triac remains in its conductive state, the AC power is effectively applied to the load. When the light emitting diode turns off at time $t_2$, the photodarlington circuit 21 turns off and this, in turn, causes the triac to open and prevents current from flowing therethrough. This turns off the triac and causes it to return to its non-conductive state and thereby cut off the AC power from the load.

It is to be noted that an inherent nature of the triac is such that it can be triggered with either positive or negative voltage applied to its gate.

Figure 4:
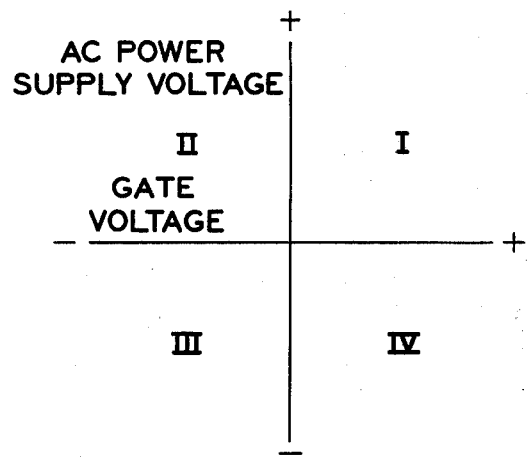
FIG. 4 shows quardrature relationship of the gate voltage and the load voltage.

However, in accordance with an aspect of the present invention, preferably the photodarlington circuit is arranged so that it applies negative voltage to trigger the triac. This is made possible by using the NPN transistor as shown and biasing the emitter 35 of the phototransistor negative using the DC from the rectifier 23. By driving gating electrode negative, the triac is driven into conductive state either in the second (II) or third (III) quadrature as shown in FIG. 4. That is, when the negative voltage from the darlington circuit is applied, the gate electrode 18 conducts while the AC voltage is in its positive cycle. This can be seen as driving the triac in its second quadrant (II). When the same takes place except that the AC voltage is in its negative cycle this can be seen as driving the triac conducting in its third quadrant (III). The triac could be driven in the first (I) or fourth (IV) quadrant with positive voltage from the photodarlington as stated before. However, it has been found here that the triac requires more gating current to trigger it to conduct. Thus, it is preferable to trigger the triac in its second and third quadrant in that it requires less amount of gating current.

Figure 5:
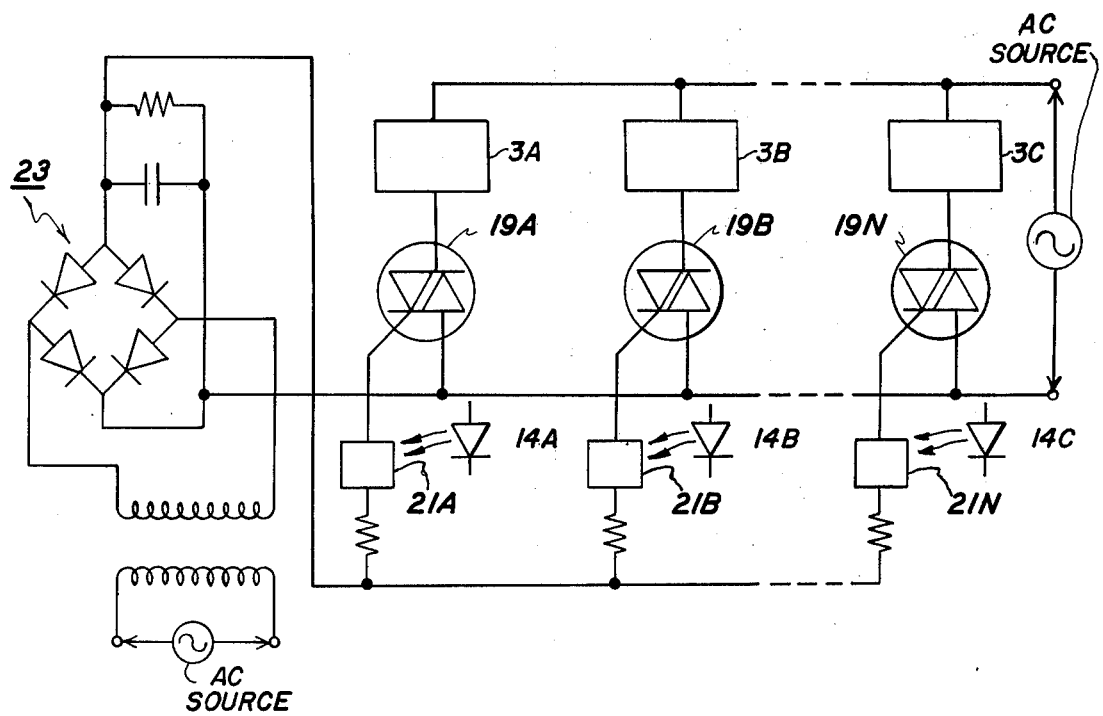
FIG. 5 shows a bank of triacs and photodarlington circuits for controlling a plurality of corresponding AC loads.

In the foregoing, the present invention is illustrated in terms of a specific embodiment shown in FIG. 2. Various other modifications and changes may be made to the embodiment without departing from the spirit and scope of the present invention. For example, as shown in FIG. 5, a bank of triacs 19A, 19B . . . 19N may be controlled by corresponding photodarlington circuits 21A, 21B . . . 21N with the AC power supply providing a common DC bias voltage to all of the photodarlington circuits via the bridge rectifier.

What is claimed is:

1. In a circuit comprising: an A.C. source; a load; and a TRIAC for supplying A.C. power to said load from said A.C. source, said TRIAC including first and second gating electrodes, said first electrode being connected in series with said load and said A.C. source being applied across said TRIAC and said load, the improvement wherein, a trigger circuit is provided for said TRIAC comprising:

a photodarlington circuit, means for biasing said photodarlington circuit to its quiescent state in the absence of a light signal; and means for making said photodarlington circuit conductive and for enabling it to apply a negative voltage to the gate electrode of said TRIAC to make said TRIAC conductive in the presence of a light signal applied to said photodarlington circuit.

2. A circuit as in claim 1, comprising a plurality of loads, a plurality of corresponding TRIACS for supplying said A.C. power to respective loads, a plurality of photodarlington circuits connected to the gating electrodes of the corresponding ones of said plurality of TRIACS, said biasing means biasing said plurality of photodarlington circuits into their quiescent states in the absence of light signals, and plural means for selectively making said photodarlington circuits conductive to enable them to apply said negative voltage to the gate electrode of the corresponding TRIAC to make the corresponding TRIAC conductive in the presence of a light signal applied to the photodarlington circuit.

3. The according to claim 1, including a light emitting diode and logic gating means for applying input signal to said light emitting diode so that the diode becomes conductive and emit light for actuating said photodarlington circuit.

4. The circuit according to claim 1 wherein said biasing means includes a rectifying means interposed between said photodarlington circuit and said AC source for providing a DC bias voltage to said photodarlington circuit.

* * * * *